United States Patent
Arno et al.

(10) Patent No.: US 6,841,141 B2
(45) Date of Patent: Jan. 11, 2005

(54) SYSTEM FOR IN-SITU GENERATION OF FLUORINE RADICALS AND/OR FLUORINE-CONTAINING INTERHALOGEN ($XF_N$) COMPOUNDS FOR USE IN CLEANING SEMICONDUCTOR PROCESSING CHAMBERS

(75) Inventors: Jose I. Arno, Brookfield, CT (US); W. Karl Olander, Indian Shores, FL (US)

(73) Assignee: Advanced Technology Materials, Inc., Danbury, CT (US)

( * ) Notice: Subject to any disclaimer, the term of this patent is extended or adjusted under 35 U.S.C. 154(b) by 16 days.

(21) Appl. No.: 10/065,219

(22) Filed: Sep. 26, 2002

(65) Prior Publication Data

US 2004/0069610 A1 Apr. 15, 2004

(51) Int. Cl.[7] .............................. C01B 7/00; C01D 3/02; A61L 2/00
(52) U.S. Cl. .................... 423/490; 423/492; 422/22; 422/24; 204/157.48
(58) Field of Search ................ 422/22, 24; 204/157.48; 423/490, 492

(56) References Cited

U.S. PATENT DOCUMENTS

| | | | | |
|---|---|---|---|---|
| 3,876,754 A | * | 4/1975 | Pursley | ........................ 423/466 |
| 5,565,038 A | | 10/1996 | Ashley | ........................... 134/2 |

FOREIGN PATENT DOCUMENTS

| | | | | |
|---|---|---|---|---|
| JP | 2001189273 A | * | 7/2001 | ......... H01L/21/205 |
| JP | 2001267241 A | * | 9/2001 | ......... H01L/21/205 |

OTHER PUBLICATIONS

*With JPO translation.*
Y. Saito, et al., "Plasmaless Cleaning Process of Silicon Surface Using Chlorine Trifluoride", Applied Physics Letters, vol. 56(8), pp. 1119–1121 (1990), no month.
D.E. Ibbotson, et al., "Plasmaless Dry–Etching of Silicon with Fluorine–Containing Compounds", Journal of Applied Physics, vol. 56(10), pp. 2939–2942 (1984), no month.

* cited by examiner

*Primary Examiner*—Edna Wong
(74) *Attorney, Agent, or Firm*—Margaret Chappuis; Steven Hultquist, Esq.

(57) ABSTRACT

A system for in-situ generation of fluorine radicals and/or fluorine-containing interhalogen compounds $XF_n$ (wherein X is Cl, Br, or I, and n is an odd integer). Such system comprises a fluorine source, a halogen source for supplying halogen species other than fluorine, a chamber for mixing fluorine with halogen species other than fluorine, and an energy source to supply energy to such chamber to facilitate reaction between fluorine and the halogen species other than fluorine. The chamber may be a semiconductor processing chamber, wherein the in situ generated fluorine radicals and/or fluorine-containing interhalogens are employed for cleaning the processing chamber.

35 Claims, 2 Drawing Sheets

SYSTEM FOR IN-SITU GENERATION OF FLUORINE RADICALS AND/OR FLUORINE-CONTAINING INTERHALOGEN ($XF_N$) COMPOUNDS FOR USE IN CLEANING SEMICONDUCTOR PROCESSING CHAMBERS

BACKGROUND OF INVENTION

1. Field of the Invention

The invention relates to a system and method for in-situ generation of fluorine radicals and/or fluorine-containing interhalogen compounds for use in semiconductor manufacturing processes, such as removal of solid residues or particles from semiconductor equipment.

2. Description of the Related Art

Semiconductor processing generally involves decomposition of relatively volatile precursors containing silicon (Si), tungsten (W), titanium (Ti), or tantalum (Ta) to form complex metal oxides or silicates. Such volatile precursors are notorious for forming solid residues inside the semiconductor processing chamber or on other internal components of the chamber, such as wafer carders, wafer transport mechanisms, and wafer platens.

As such, solid residues accumulate on the internal surfaces of the processing chamber, and solids occasionally flake off from the solid residue deposits to yield free particles floating inside the processing chamber. These free particles, when landing on semiconductor wafers, result in wafer contamination.

It therefore is desirable to remove accumulated solid residues from the interior wall surfaces and other internal parts of the processing chamber, without attacking the structural components of the processing chamber.

Convention methods used for cleaning semiconductor processing chambers and reactors include wet scrubbing and plasma-enhanced cleaning.

Wet scrubbing methods require disassembling each component part of the processing equipment, scrubbing each part with harsh chemical reagent(s) such as HF, $H_2SO_4$, $H_3PO_4$, and $HNO_3$, rinsing the component parts with large volumes of deionized water, and reassembling those component parts.

Such approach has many inherent problems, including: the labor and time required for disassembling, cleaning, and reassembly; the high Mean-Time Off Line (MTOL) as a concomitant of the duration of the cleaning operation; the high volume of hazardous chemicals used; the risk of residual contamination; the incidence of excessive surface wear during the cleaning process; and the potential health issues related to worker exposure to hazardous chemicals.

Another conventional method for cleaning semiconductor processing chambers involves use of plasmas formed by applying radio frequency (RF) energy to perfluorinated precursors, such as $CF_4$, $NF_3$, $C_2F_6$, $C_2F_8$, and $SF_6$. The plasmas thus formed will react with the accumulated solid residues inside the semiconductor processing chamber.

Perfluorinated (PFC) gases, however, are among the six strongest greenhouse gases targeted by the Kyoto Climate Protection Protocol of 1997. They generally have global warming potentials (GWPs) three (3) and four (4) orders of magnitude higher than $CO_2$. Further, they are extremely stable molecules, tending to stay unchanged in the atmosphere for thousands of years. Moreover, most chamber cleaning systems utilizing plasma-enhanced cleaning techniques have low gas decomposition rates, resulting in high levels of PFC gases being released into the atmosphere.

Plasmaless or dry cleaning processes using chlorine trifluoride ($ClF_3$) and other fluorine radicals and/or fluorine-containing interhalogens have recently proved to be effective in removing solid residues from semiconductor processing chamber. $ClF_3$ and other fluorine radicals and/or fluorine-containing interhalogens react with such solid residues to form volatile reaction products, which can be readily removed from the processing chamber by vacuum or other devices. See Y. Saito et al., "Plasmaless Cleaning Process of Silicon Surface Using Chlorine Trifluoride", Applied Physics Letters, vol. 56(8), pp. 1119–1121 (1990); also see D. E. Ibbotson et al., "Plasmaless Dry Etching of Silicon with Fluorine-Containing Compounds", Journal of Applied Physics, vol. 56(10), pp. 2939–2942 (1984); also see Ashley U.S. Pat. No. 5,565,038 entitled "Interhalogen Cleaning of Process Equipment," issued Oct. 15, 1996.

The use of fluorine radicals or fluorine-containing interhalogens for cleaning of semiconductor processing equipment, however, faces practical problems of implementation and commercial viability.

For example, the supply of fluorine radicals or fluorine-containing interhalogens, including $ClF_3$, are highly corrosive, and issues such as compatibility of storage and dispensing vessels, and associated process piping and componentry, require substantial attention and costly solutions.

Further, interhalogen compounds are extremely irritating to human respiratory tracts. The threshold level of human tolerance of $ClF_3$ vapor is as low as 100 ppb, and an LC 50, 1 hour of 300 ppm. Inadvertent leakage of such highly toxic fluid is therefore highly hazardous to human health. Further, most interhalogen compounds are liquids at room temperature and are transported in the liquid phase, and the inherent high density of liquids over gases accentuates many of the risks associated with transporting such compounds.

Thus, it would be a significant advance in the art to provide a system and method that generates fluorine radicals and/or fluorine-containing interhalogens with minimized risk of exposure to these compounds and that overcomes problems otherwise associated with transporting and storing highly reactive fluorine radicals and fluorine-containing interhalogens.

SUMMARY OF INVENTION

The present invention broadly relates to a system and method for in-situ generation of fluorine radicals (hereinafter "F radicals") and/or fluorine-containing interhalogen compounds (hereinafter "$XF_n$", wherein X is Cl, Br, or I, and n=1, 3, 5, or 7) using materials that are less hazardous than $ClF_3$.

A specific aspect of the present invention relates to an in-situ fluorine radicals and/or fluorine-containing interhalogen compounds (e.g., $XF_n$ compounds) generation system for use in semiconductor manufacturing processes, such system comprising:

(a) a fluorine source for supplying fluorine gas;

(b) a halogen source for supplying at least one halogen species selected from the group consisting of $Cl_2$, $Br_2$, and $I_2$;

(c) a processing chamber communicatively connected with the fluorine source and the halogen source; and (d) an energy source for supplying external energy to facilitate generation of fluorine radicals and/or fluorine-containing interhalogen compounds.

The energy source in such system can be of any suitable type, providing the appropriate energy for the process. For example, the energy generated by the energy source can comprise photoenergy or thermal energy. Ultraviolet (hereinafter UV) light having a wavelength from about 100 nm to about 400 nm is one type of photoenergy that is particularly effective in enhancing the reaction rate of fluorine gas and other halogen species to yield F radicals and/or $XF_n$ by photolysis.

Any suitable type of UV light generators well known in the art can be used for practicing the present invention, as is readily determinable by a person ordinarily skilled in the art without undue experimentation. For example, such UV generators may comprise hydrogen lamps, deuterium lamps, xenon discharge lamps, electric arcs, discharge tubes, incandescent devices, flash tubes, pulsed lasers, and the like.

In a specific embodiment of the present invention, the fluorine gas and the halogen species are separately transported into the processing chamber and mixed therein to form F radicals and/or $XF_n$. In such manner, the processing chamber to be cleaned subsequently functions as reaction chamber for the fluorine gas and the halogen species. F radicals and/or $XF_n$ species locally formed in such processing chamber subsequently react with solid residues accumulated in such processing chamber and effect removal of those solid residues.

Therefore, the external energy source is communicatively connected to the processing chamber to supply external energy to the processing chamber, to effectively facilitate reaction of fluorine and other halogen species. In order to efficiently control the reaction process, the processing chamber comprises temperature/pressure monitoring and controlling devices. The reaction temperature inside the processing chamber is generally controlled within the range from about room temperature (i.e., about 20° C.) to about 350° C., preferably from about room temperature to about 100° C. when photoenergy is primarily supplied, or from about 280° C. to about 350° C. when thermal energy is primarily supplied. Pressure in the processing chamber is controlled within a range from about 1 Torr to about 1000 Torr.

In an alternative embodiment of the present invention, the fluorine gas and the halogen species are mixed before entering the processing chamber, either in fluid delivery conduits or in a separate mixing chamber.

Preferably, the in-situ generation system of the present invention further comprises a separate mixing chamber upstream the processing chamber. Fluorine gas and other halogen species are first flowed into such mixing chamber to form F radicals and/or $XF_n$ compounds. The formed F radicals and/or $XF_n$ compounds are subsequently transported into the processing chamber to react with accumulated residues in the processing chamber for the purpose of removing such residues.

When such separate mixing chamber is employed, the energy source will supply photoenergy or thermal energy directly to such mixing chamber. Similarly, such mixing chamber may comprise temperature/pressure monitoring and controlling devices for effective control of reaction conditions as specified hereinabove.

In a more preferred embodiment, the in-situ generation system comprises a separate holding chamber between said mixing chamber and said processing chamber. The F radicals and/or $XF_n$ gases formed in the mixing chamber may be flowed first into the holding chamber and stored therein until a pre-determined pressure threshold is reached. Such holding chamber serves to allow immediate gas flow to the processing chamber on demand and to shorten the "waiting-period" associated with generation startup or reaction initialization. The holding chamber may further comprise flow-regulating devices, such as a mass flow controller, to achieve reproducible delivery of F radicals and/or $XF_n$ compounds into the processing chamber.

Furthermore, such in-situ generation system may comprise an exhaust/abatement system downstream of said processing chamber to receive an effluent gas stream discharged by the processing chamber.

In another preferred embodiment of the present invention, the in-situ generation system comprises at least one bypassing line for flowing the fluorine gas and halogen species, either separately or in mixture, without passing through the processing chamber. Such bypassing line enables stable fluid flow within the system, regardless of whether the processing chamber is in a cleaning stage or a wafer-processing stage (during which time the processing chamber is isolated from the in-situ generation system). More preferably, such bypassing line functions to circulate unmixed fluorine gas and halogen species back to the fluorine and halogen source vessels for recycling.

In yet another preferred embodiment of the present invention, the in-situ generation system comprises a diluent gas source connected with the processing chamber for supplying a relatively inert gas to dilute the generated F radicals and/or $XF_n$ compounds. Because F radicals and/or interhalogen compounds react with solid residues in the processing chamber at an exceedingly rapid rate, forming gaseous end products, the use of pure F radicals and/or interhalogen fluids generated can cause over-pressurizing of the processing chamber. Such over-pressurizing can in turn lead to fluctuation of internal pressure or, more seriously, rupture of the process chamber, or leakage therefrom. Therefore, it is desirable to employ a relatively inert gas to dilute the F radicals and/or $XF_n$ compounds to reduce the reaction rate.

The term "relatively inert gas" as used herein refers to gases that are non-reactive or that react only insignificantly with the solid residues inside the processing chamber. Such gases include, but are not limited to, Ar, He, and $N_2$. $N_2$ is a preferred diluent for the practice of the present invention.

A specific aspect of the present invention relates to an apparatus for generating $ClF_3$, comprising:

(a) a fluorine gas source;

(b) a chlorine gas source;

(c) a mixing chamber communicatively connected with said fluorine gas source and the chlorine gas source, for mixing fluorine and chlorine gases;

(d) a photoenergy source for supplying photoenergy to said mixing chamber to facilitate generation of chlorine trifluoride therein; and (e) a processing chamber connected with said mixing chamber.

Another specific aspect of the present invention relates to an apparatus for generating $ClF_3$, comprising:

(a) a fluorine gas source;

(b) a chlorine gas source;

(c) a processing chamber communicatively connected with said fluorine gas source and the chlorine gas source; and (d) a photoenergy source for supplying photoenergy to the processing chamber to facilitate generation of chlorine trifluoride therein.

Yet another aspect of the present invention relates to a method for in-situ generation of F radicals and/or $XF_n$ compounds for use in a semiconductor manufacturing process, comprising the steps of:

(a) providing a fluorine source for supplying fluorine gas;

(b) providing a halogen source for at least one halogen species selected from the group consisting of $Cl_2$, $Br_2$, and $I_2$;

(c) flowing the fluorine gas and the halogen species into a processing chamber communicatively connected with the fluorine source and the halogen source; and (d) generating fluorine radicals and/or fluorine-containing interhalogen compounds by supplying external energy to the fluorine gas and/or the halogen species.

A further aspect of the present invention relates to a method of generating $ClF_3$, for cleaning of a processing chamber, comprising the steps of:

(a) providing a fluorine gas source;

(b) providing a chlorine gas source;

(c) mixing fluorine and chlorine gases in a mixing chamber communicatively connected with said fluorine gas source and said chlorine gas source;

(d) supplying photoenergy to said mixing chamber from a photoenergy source to generate chlorine trifluoride in such mixing chamber; and (e) flowing chlorine trifluoride from the mixing chamber into the processing chamber.

A still further aspect of the present invention relates to a method of generating $ClF_3$, comprising the steps of:

(a) providing a fluorine gas source;

(b) providing a chlorine gas source;

(c) flowing fluorine gas and chlorine gas from said gas sources into a processing chamber; and (d) supplying photoenergy to said processing chamber from a photoenergy source to generate chlorine trifluoride in such processing chamber.

Another aspect of the present invention relates to a system for generating fluorine radicals and/or fluorine-containing interhalogen compounds, comprising a fluorine source, a halogen source for supplying at least one halogen species other than fluorine, an enclosure for mixing fluorine with said halogen species other than fluorine, and a photoenergy source for supplying photoenergy to said enclosure. The fluorine-containing interhalogen compounds have a general formula $XF_n$, wherein X=Cl, Br, or I, and n=1, 3, 5, or 7. The photoenergy supplied by said photoenergy source may comprise ultraviolet light having a wavelength from about 100 nm to about 400 nm and intensity in a range of from about $10^3$ W/m$^2$ to about $10^6$ W/m$^2$.

In a yet further aspect, the present invention relates to a method for generating fluorine radicals and/or fluorine-containing interhalogen compounds, comprising the steps of providing a fluorine source and a halogen source for supplying fluorine and at least one halogen species other than fluorine, mixing fluorine with the halogen species in an enclosure, and supplying photoenergy to the enclosure from a photoenergy source to generate fluorine radicals and/or fluorine-containing interhalogen compounds. The fluorine-containing interhalogen compounds have a general formula $XF_n$, wherein X=Cl, Br, or I, and n=1, 3, 5, or 7. The photoenergy supplied by the photoenergy source preferably comprises ultraviolet light.

Other aspects, features, and embodiments of the invention will be more fully apparent from the ensuing disclosure and appended claims.

DETAILED DESCRIPTION

Figure 1:
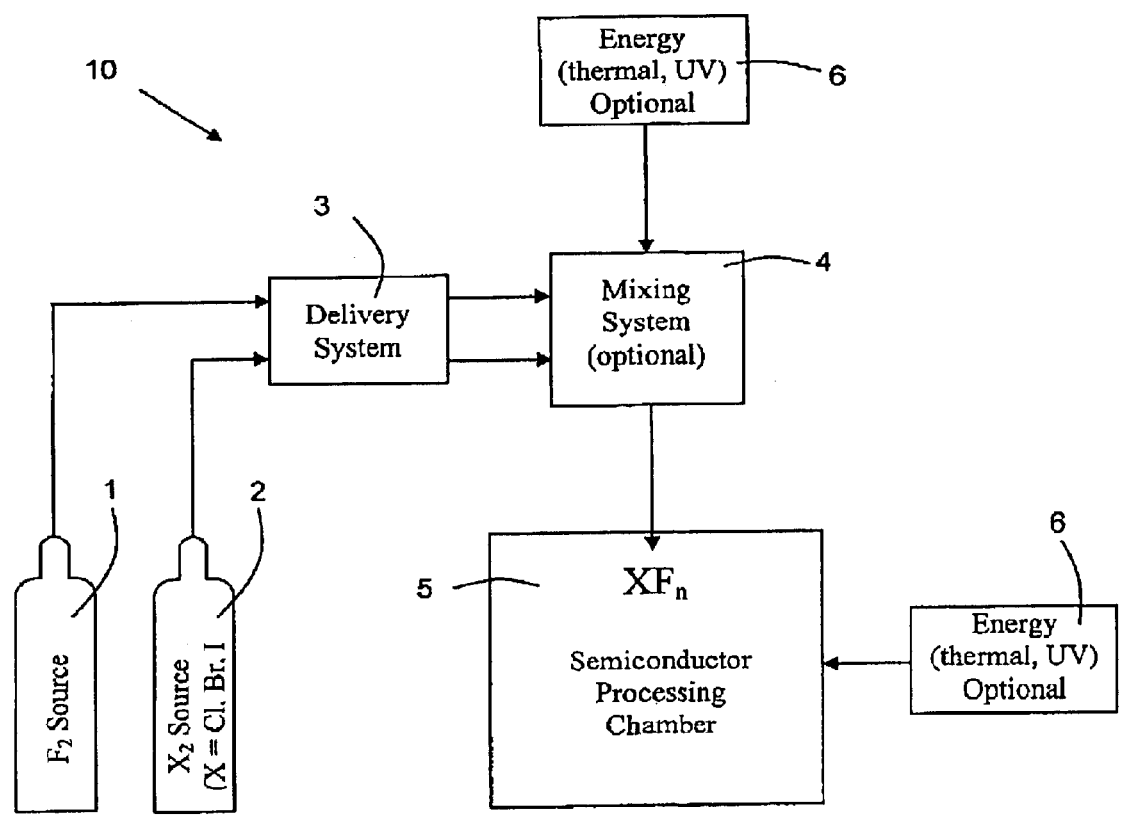
FIG. 1 is a diagrammatic illustration of in-situ F radical and/or $XF_n$ generation system according to one embodiment of the invention.

F-containing interhalogens, including $ClF_3$, are molecular compounds of fluorine with other halogens. They can be formed by reacting fluorine gas with another halogen species, according to the following equations:

$$X_2 + F_2 \longleftrightarrow 2XF \quad (1)$$

$$XF + F_2 \longleftrightarrow XF_3 \quad (2)$$

$$XF_3 + F_2 \longleftrightarrow XF_5 \quad (3)$$

$$XF_5 + F_2 \longleftrightarrow XF_7 \quad (4)$$

(X=Cl, Br, or I)

The present invention provides an in-situ generation system for locally and on-demand generation of fluorine-containing interhalogens through direct combination of fluorine gas with other halogen elements, under controlled reaction conditions. Such local and on-demand generation of interhalogens overcomes many hazards associated with transporting, facilitating, and storing highly reactive fluorine-containing interhalogens.

The in-situ generation system of the present invention comprises a fluorine source and a halogen source for supplying at least one halogen species other than fluorine. The fluorine and halogen sources may be in-situ generators of fluorine and halogens. Use of such in-situ generators further reduces risks associated with transporting and storage of the reactive fluorine and other halogen species.

The fluorine gas and other halogen species supplied can be mixed either in the semiconductor processing chamber or immediately before entering the processing chamber to form F radicals or $XF_n$ compounds for cleaning such processing chamber.

Although fluorine gas is capable of reacting with other halogen species at room temperature, the major reaction product formed at such temperature is XF, according to equation (1), and the reaction rate is relatively slow.

In order to fasten the reaction or to obtain a reaction product characterized by higher fluorine ratio as in equations (2), (3), and (4), external energy is utilized to achieve a favorable reaction equilibrium.

Accordingly, the in-situ system of the present invention advantageously comprises an energy source for supplying external energy to facilitate formation of $XF_n$ compounds at a higher reaction rate and a higher fluorine incorporation rate.

The energy source may supply thermal energy to the mixture of fluorine gas and other halogen species to enhance reaction rate and fluorine incorporation rate. If thermal energy is the primary energy supplied, it is desirable to maintain the reaction temperature within a range of from about 280° C. to about 350° C. and the reaction pressure within a range of from about 1 Torr to about 1000 Torr. Useful thermal energy sources include, but are not limited to, electric heaters, heater exchangers, and radiators.

It has been found that photoenergy can be supplied in place of thermal energy to enhance reaction kinetics. Specifically, ultraviolet-irradiation has been discovered to significantly enhance the reaction rate between fluorine gas and other halogen species as well as to achieve production yields of $XF_n$ compounds with n>1, in the absence of any external heating.

Photoenergy is substantially more efficient and is used to achieve a higher energy input to the irradiated atoms and molecules, compared with use of thermal energy. Further, thermal energy dissipates much faster than photoenergy and therefore has a higher waste rate. Finally, use of photoenergy reduces risks associated with pressure-fluctuation caused by thermal heating of an enclosure filled with gases.

Accordingly, the in-situ generation of the present invention preferably uses photoenergy supplied by a photoenergy source.

More preferably, such photoenergy comprises ultraviolet light having a wavelength in a range of from about 100 nm to about 400 nm and an energy density of from about $10^3$ $W/m^2$ to about $10^6$ $W/m^2$.

Any suitable type of UV light generators well known in the art may be used for practicing the present invention, including but not limited to hydrogen lamps, deuterium lamps, xenon discharge lamps, electric arcs, discharge tubes, incandescent devices, flash tubes, pulsed lasers, and the like.

When photoenergy is the primary energy supplied, the reaction temperature of fluorine gas and other halogen species may be maintained within a lower range of from about room temperature (i.e., about 20° C.) to about 100° C.

Additional heating may be utilized concurrently with the photoenergy, but it is not required. The reaction will readily proceed with satisfactory speed and production yield without such external heating.

Mixing and reacting of precursor gases may be accomplished directly within the processing chamber, or immediately before entering into the processing chamber.

In one specific embodiment of the present invention, the precursor gases are flowed separately into the processing chamber and mixed therein to form F radicals and/or $XF_n$ compounds. In such embodiment, formation of F radicals and/or XFn is carried out concurrently with cleaning of the processing chamber. The energy source directly supplies external energy to the processing chamber to facilitate reaction of precursor gases.

Supplying external energy directly to the processing chamber provides several advantages. For example, not only the generation of F radicals and/or XFn, but also reaction between the generated F radicals and/or $XF_n$ and the solid residues within the processing chamber, is substantially enhanced by provision of external energy to the processing chamber.

In an alternative embodiment of the present invention, the precursor gases are mixed and reacted first in a separate mixing chamber immediately before entering the processing chamber. In this embodiment, the energy source supplies external energy to the mixing chamber.

In order to control the reaction conditions and to achieve highly efficient cleaning action, temperature/pressure monitoring and controlling devices can be employed. Such devices are well known in the art, and one ordinarily skilled in the art will be able to determine suitable types of such devices without undue effort, according to specific operational conditions and requirements.

The features and practice of the present invention are more fully appreciated with respect to the following discussion.

FIG. 1 shows an in-situ generation system 10, which comprises a fluorine source 1, a halogen source 2 for supplying halogen species such as $Cl_2$, $Br_2$, and/or $I_2$, a delivery system 3, a mixing system 4, a semiconductor processing chamber 5, and energy sources 6. Fluorine gas and halogen species are provided by the fluorine source 1 and halogen source 2, respectively, and then transported to the mixing system 4 by the delivery system 3. Thermal or ultraviolet energy is supplied by energy source 6 to the mixing system for the purpose of enhancing reaction rate and production yield of $XF_n$ compounds with higher F ratio. Reaction products comprising F radicals and/or $XF_n$ compounds are then delivered into the semiconductor processing chamber 5 for removing solid residues inside such chamber. The fluorine gas and halogen species optionally and alternatively can be directly transported into the processing chamber 5 without passing the mixing system 4. In such case, the energy source supplies thermal or ultraviolet energy to the processing chamber 5 in a direct manner.

Figure 2:
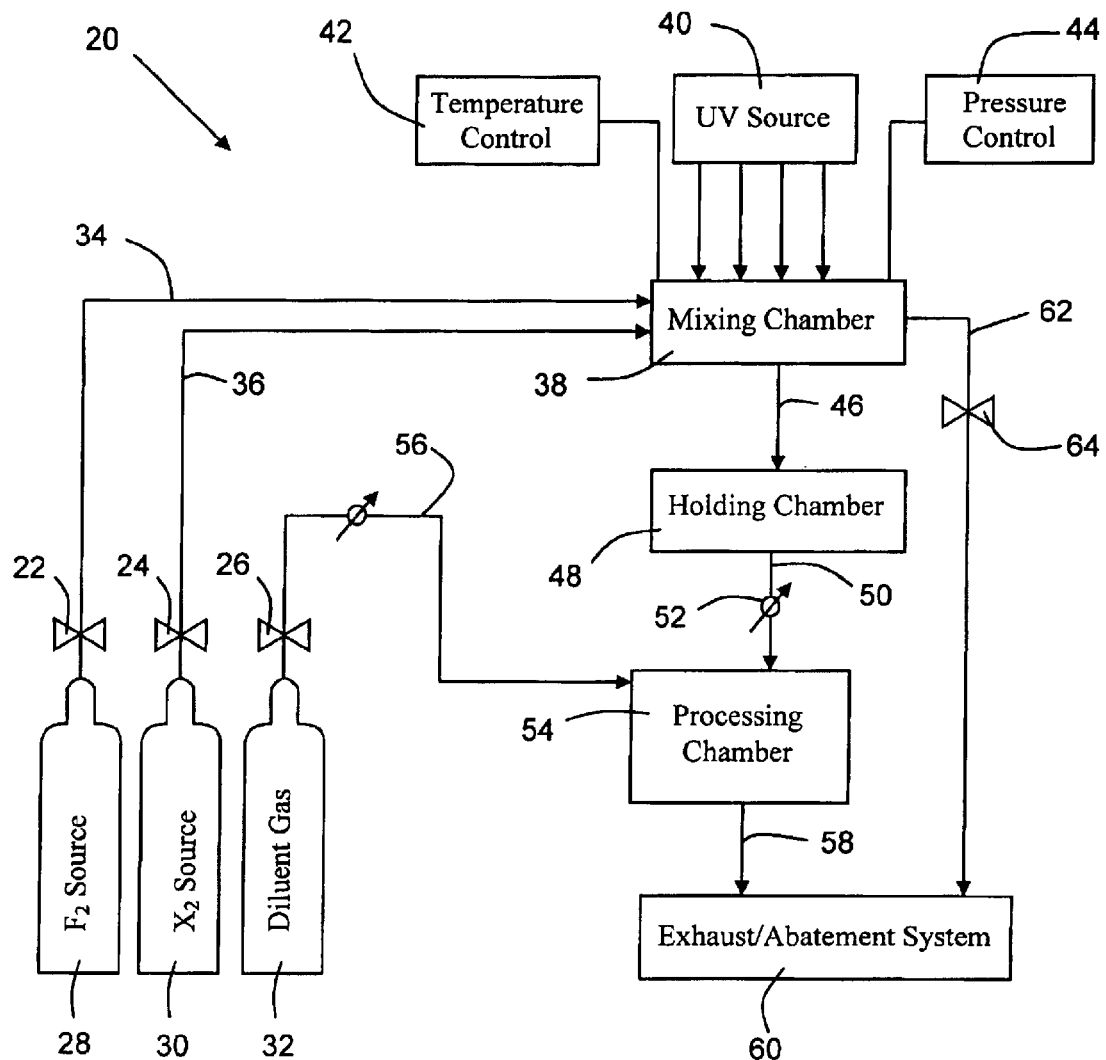
FIG. 2 is a diagrammatic illustration of another specific embodiment of an in-situ F radical and/or $XF_n$ generation system.

FIG. 2 shows another in-situ generation system 20, according to a preferred embodiment of the present invention. Fluorine gas and other halogen species are supplied by fluorine source 28 and halogen source 30, which are under operative control of flow control valves 22 and 24. When the flow control valves 22 and 24 are turned on, the fluorine gas and the halogen species are separately transported by fluid flow conduits 34 and 36, respectively, into mixing chamber 38. Precursor gases are mixed and reacted in the mixing chamber 38, under control of temperature control device 42 and pressure control device 44. UV source 40 applies UV-irradiation to mixing chamber 38 to facilitate reactions between the fluorine gas and the other halogen species.

Preferably, the UV source provides UV light at an intensity of from about $10^{32}$ to about $10^6$ W/m$^2$.

Reaction products of fluorine gas and other halogen species are transported by fluid flow conduit 46 into a holding chamber 48. When internal pressure within the holding chamber 48 reaches a pre-determined level, mass flow controller 52 can be opened to allow flow of generated F radicals and/or XF$_n$ compounds through fluid flow conduit 50 into processing chamber 54 to clean interior of such processing chamber. After the cleaning process is completed, the effluent gas stream is discharged from the processing chamber 54 into an exhaust/abatement system 60 through fluid flow conduit 58.

The system also comprises a bypassing line 62 controlled by a bypassing valve 64 for flowing reaction products generated by the mixing chamber 38 directly into the exhaust/abatement system 60, without passing the processing chamber 54. Such bypassing line is useful for maintaining system stability during wafer-processing cycle when the processing chamber is isolated from the rest of the system (otherwise F radicals and/or XF$_n$ compounds will contaminate the wafer products).

A diluent gas source 32 is also provided for supplying relatively inert gas, such as Ar, He, or N$_2$, to dilute the F radicals and/or XF$_n$ compounds delivered into the processing chamber 54. Such diluent gas source 32 is controlled by a flow control valve 26 as well as a mass flow controller 56. Diluent gas will effectively reduce reaction rates between the F radicals and/or XF$_n$ compounds and the solid residues in the processing chamber 54, so as to avoid sudden pressure increase inside the processing chamber 54.

- - - Although the invention has been described herein with reference to specific features, aspects and embodiments, it will be appreciated that the applicability of the invention is not thus limited, but readily extends to and encompasses numerous variations, modifications and other embodiments, as will readily suggest themselves to those of ordinary skill in the art. Accordingly, the invention is to be broadly construed, consistent with the claims hereafter set forth.

What is claimed is:

1. A method for in-situ generation of fluorine radicals and/or fluorine-containing interhalogen compounds for use in cleaning a semiconductor processing chamber, comprising the steps of:

(a) providing a fluorine source for supplying fluorine gas;

(b) providing a halogen source for supplying at least one halogen species selected from the group consisting of Cl$_2$, Br$_2$, and I$_2$;

wherein said method is characterized by at least one of the following sequences (I), (II), and (III) of steps:

(I) (i) flowing the fluorine gas and the halogen species from said respective sources therefor into the semiconductor processing chamber communicatively connected with said sources, without any intervening holdup of said fluorine gas and halogen species between the respective sources and the semiconductor processing chamber; and (ii) generating the fluorine radicals and/or fluorine-containing interhalogen compounds by introducing external energy from an energy source into the semiconductor processing chamber containing the fluorine gas and the halogen species;

(II) (i) providing a diluent gas source for supplying at least one inert gas;

(ii) flowing the fluorine gas and the halogen species into the semiconductor processing chamber communicatively connected with the fluorine source and the halogen source;

(iii) generating the fluorine radicals and/or fluorine-containing interhalogen compounds by introducing external energy from an energy source into the semiconductor processing chamber containing the fluorine gas and the halogen species; and (iv) flowing the diluent gas into the semiconductor processing chamber to dilute the fluorine radicals and/or fluorine-containing interhalogen compounds contained therein; and (III) (i) flowing the fluorine gas and the halogen species into a mixing chamber communicatively connected with the fluorine source and the halogen source;

(ii) generating the fluorine radicals and/or fluorine-containing interhalogen compounds by introducing external energy from an energy source into the mixing chamber containing the fluorine gas and the halogen species;

(iii) flowing the generated fluorine radicals and/or fluorine-containing interhalogen compounds from the mixing chamber into a holding chamber for storage until a pre-determined pressure threshold is reached; and (iv) flowing the generated fluorine radicals and/or fluorine-containing interhalogen compounds from the holding chamber into the semiconductor processing chamber to effect cleaning therein, wherein the flow rate of the formed fluorine radicals and/or fluorine-containing interhalogen compounds from the holding chamber into the semiconductor processing chamber is monitored and controlled.

2. The method of claim 1, wherein the fluorine-containing interhalogen compounds have a general formula XF$_n$, and wherein X=Cl, Br, or I, and n=1, 3, 5, or 7.

3. The method of claim 1, wherein the energy source supplies photoenergy.

4. The method of claim 1, wherein the energy source supplies ultraviolet light.

5. The method of claim 1, wherein the ultraviolet light has a wavelength in the range from about 100 nm to about 400 nm.

6. The method of claim 1, wherein the energy source is selected from the group consisting of hydrogen lamps, deuterium lamps, xenon discharge lamps, electric arcs, discharge tubes, incandescent devices, flash tubes, and pulsed lasers.

7. The method of claim 1, wherein the energy source supplies thermal energy.

8. The method of claim 1, comprising sequence (I) or (II), wherein the fluorine gas and the halogen species are separately flowed into the semiconductor processing chamber and mixed therein to form the fluorine radicals and/or fluorine-containing interhalogen compounds.

9. The method of claim 1, wherein the semiconductor processing chamber is equipped with temperature monitoring and controlling devices.

10. The method of claim 1, wherein temperature in the semiconductor processing chamber is in a range of from about room temperature to about 350° C.

11. The method of claim 1, wherein temperature in the semiconductor processing chamber is in a range of from about room temperature to about 100° C.

12. The method of claim 1, wherein temperature within the semiconductor processing chamber is in a range of from about 280° C. to about 350° C.

13. The method of claim 1, wherein the semiconductor processing chamber is equipped with pressure monitoring and controlling devices.

14. The method of claim 13, wherein pressure in the semiconductor processing chamber is in a range of from about 1 Torr to about 1000 Torr.

15. The method of claim 1, comprising sequence (I) or (II), wherein the fluorine gas and the halogen species are mixed in a fluid delivery conduit before entering the semiconductor processing chamber.

16. The method of claim 1, comprising sequence (III), wherein the mixing chamber is equipped with temperature monitoring and controlling devices.

17. The method of claim 1, comprising sequence (III), wherein temperature in the mixing chamber is in a range of from about room temperature to about 350° C.

18. The method of claim 1, comprising sequence (III), wherein temperature in the mixing chamber is in a range of from about room temperature to about 100° C.

19. The method of claim 1, comprising sequence (III), wherein temperature within the mixing chamber is in a range of from about 280° C. to about 350° C.

20. The method of claim 1, sequence (III), wherein the mixing chamber is equipped with pressure monitoring and controlling devices.

21. The method of claim 1, comprising sequence (III), wherein pressure in the mixing chamber is in a range of from about 1 Torr to about 1000 Torr.

22. The method of claim 1, comprising sequence (III), wherein said holding chamber is equipped with a mass flow controller.

23. The method of claim 1, further comprising the step of flowing an effluent gas stream discharged by said semiconductor processing chamber into a downstream exhaust/abatement system.

24. The method of claim 1, further providing at least one bypassing line for flowing the fluorine gas and halogen species, either separately or in mixture, without passing through the semiconductor processing chamber.

25. The method of claim 1, comprising sequence (I) or (III), further comprising supplying an inert gas from a diluent gas source connected with the semiconductor processing chamber, to dilute the generated fluorine radicals and/or fluorine-containing interhalogen compounds.

26. The method of claim 25, wherein the inert gas supplied by said diluent gas source comprises at least one gas species selected from the group consisting of Ar, He, and $N_2$.

27. The method of claim 1, comprising sequence (III), wherein the fluorine gas and the halogen species are separately flowed into the mixing chamber and mixed therein to form the fluorine radicals and/or fluorine-containing interhalogen compounds.

28. A method for in-situ generation of fluorine radicals and/or fluorine-containing interhalogen compounds for use in cleaning a semiconductor processing chamber, comprising the steps of:
(a) providing a fluorine source for supplying fluorine gas;
(b) providing a halogen source for supplying at least one halogen species selected from the group consisting of $Cl_2$, $Br_2$, and $I_2$;
(c) flowing the fluorine gas and the halogen species into a mixing chamber communicatively connected with the fluorine source and the halogen source;
(d) generating the fluorine radicals and/or fluorine-containing interhalogen compounds by introducing external energy from an energy source into the mixing chamber containing the fluorine gas and the halogen species;
(e) flowing the generated fluorine radicals and/or fluorine-containing interhalogen compounds from the mixing chamber into a holding chamber for storage until a pre-determined pressure threshold is reached; and
(f) flowing the generated fluorine radicals and/or fluorine-containing interhalogen compounds from the holding chamber into the semiconductor processing chamber to effect cleaning therein, wherein the flow rate of the formed fluorine radicals and/or fluorine-containing interhalogen compounds from the holding chamber into the semiconductor processing chamber is monitored and controlled.

29. A method for generating chlorine trifluoride, comprising the steps of:
(a) providing a chlorine gas source;
(b) providing a chlorine gas source;
(c) flowing fluorine gas and chlorine gas from said gas sources into a semiconductor processing chamber; and
(d) supplying photoenergy to said processing chamber from a photoenergy source to facilitate generation of chlorine trifluoride in the semiconductor processing chamber.

30. A method for generating fluorine radicals and/or fluorine-containing interhalogen compounds, comprising the steps of
(i) providing a fluorine source for supplying fluorine gas;
(ii) providing a halogen source for supplying at least one halogen species other than fluorine;
(iii) providing a diluent source for supplying a relatively inert gas;
(iv) mixing fluorine with said halogen species in an enclosure;
(v) supplying photoenergy to said enclosure from a photoenergy source to facilitate generation of the fluorine radicals and/or fluorine-containing interhalogen compounds; and
(vi) supplying the inert gas to the enclosure to dilute the generated fluorine radicals and/or fluorine-containing interhalogen compounds.

31. The method of claim 30, wherein the fluorine-containing interhalogen compounds have a general formula $XF_n$, and wherein X=Cl, Br, or I, and n=1, 3, 5, or 7.

32. The method of claim 30, wherein the photoenergy supplied by said photoenergy source comprises ultraviolet light.

33. A method for in-situ generation of fluorine radicals and/or fluorine-containing interhalogen compounds for use in cleaning a semiconductor processing chamber, comprising the steps of:

(a) providing a fluorine source for supplying fluorine gas;

(b) providing a halogen source for supplying at least one halogen species selected from the group consisting of $Cl_2$, $Br_2$, and $I_2$;

(c) providing a diluent gas source for supplying at least one inert gas;

(d) flowing the fluorine gas and the halogen species into a mixing chamber communicatively connected with the fluorine source and the halogen source;

(e) generating the fluorine radicals and/or fluorine-containing interhalogen compounds by introducing external energy from an energy source into the mixing chamber containing the fluorine gas and the halogen species;

(f) flowing the fluorine radicals and/or fluorine-containing interhalogen compounds into the semiconductor processing chamber communicatively connected with the mixing chamber; and (g) flowing the diluent gas into the semiconductor processing chamber to dilute the fluorine radicals and/or fluorine-containing interhalogen compounds contained therein.

34. The method of claim 33, further comprising the step of flowing the formed fluorine radicals and/or fluorine-containing interhalogen compounds into a holding chamber positioned between said mixing chamber and said semiconductor processing chamber before entering into the semiconductor processing chamber.

35. The method of claim 33, wherein the fluorine-containing interhalogen compounds have a general formula $XF_n$, and wherein X=Cl, Br, or I, and n=1, 3, 5, or 7.

* * * * *

UNITED STATES PATENT AND TRADEMARK OFFICE
CERTIFICATE OF CORRECTION

PATENT NO. : 6,841,141 B2  Page 1 of 1
APPLICATION NO. : 10/065219
DATED : January 11, 2005
INVENTOR(S) : Jose I. Arno et al.

It is certified that error appears in the above-identified patent and that said Letters Patent is hereby corrected as shown below:

Column 9, line 13: "about $10^{32}$ to about" should be -- about $10^3$ W/m$^2$ to about --.

Column 12, line 40 (claim 29): "(a) providing a chlorine gas source" should be -- (a) providing a fluorine gas source --.

Signed and Sealed this

Eighteenth Day of March, 2008

JON W. DUDAS
*Director of the United States Patent and Trademark Office*